(12) United States Patent
Chow et al.

(10) Patent No.: US 7,064,430 B2
(45) Date of Patent: Jun. 20, 2006

(54) STACKED DIE PACKAGING AND FABRICATION METHOD

(75) Inventors: Seng Guan Chow, Singapore (SG); Ming Ying, Singapore (SG); Il Kwon Shim, Singapore (SG); Roger Emigh, Mesa, AZ (US)

(73) Assignee: Stats Chippac Ltd., Singapore (SG)

( * ) Notice: Subject to any disclaimer, the term of this patent is extended or adjusted under 35 U.S.C. 154(b) by 10 days.

(21) Appl. No.: 10/931,919

(22) Filed: Aug. 31, 2004

(65) Prior Publication Data

US 2006/0043559 A1   Mar. 2, 2006

(51) Int. Cl.
*H01L 23/34* (2006.01)

(52) U.S. Cl. .................. 257/723; 257/686; 257/777

(58) Field of Classification Search ........... None
See application file for complete search history.

(56) References Cited

U.S. PATENT DOCUMENTS

| 5,963,794 A | 10/1999 | Fogal et al. |
| 6,215,193 B1 | 4/2001 | Tao et al. |
| 6,337,226 B1 | 1/2002 | Symons |
| 6,461,897 B1 | 10/2002 | Lin et al. |
| 6,633,086 B1 | 10/2003 | Peng et al. |
| 2003/0038374 A1 | 2/2003 | Shim et al. |
| 2003/0047798 A1 | 3/2003 | Halahan |

*Primary Examiner*—Tu-Tu Ho

(74) *Attorney, Agent, or Firm*—Mikio Ishimaru

(57) ABSTRACT

A semiconductor package includes a substrate. A crenellated spacer is attached to the substrate. At least one top die is attached to the crenellated spacer. The at least one top die is wire bonded to the substrate, and an encapsulant is formed over the crenellated spacer and the at least one top die.

16 Claims, 5 Drawing Sheets

STACKED DIE PACKAGING AND FABRICATION METHOD

TECHNICAL FIELD

The present invention relates generally to semiconductor devices, and more particularly, to multi-chip semiconductor packages that have stacked dies.

BACKGROUND ART

Semiconductors, or computer chips, have made their way into virtually every electrical product manufactured today. Chips are used not only in very sophisticated industrial and commercial electronic equipment, but also in many household and consumer items such as televisions, clothes washers and dryers, radios and telephones. As many of these types of products become smaller but more functional, there is a need to include more chips in these smaller products. The reduction in size of cellular telephones is one example of how more and more capabilities find their way into smaller and smaller electronic products.

As the demand for semiconductor devices with low-cost, high performance, increased miniaturization, and greater packaging densities has increased, Multi-Chip Module (MCM) structures have been developed to meet this demand. MCM structures have a number of dies and other semiconductor components mounted within a single semiconductor package. The number of dies and other components can be mounted in a vertical manner, a lateral manner, or combinations thereof.

One such approach is to stack one die on top of another and then enclose the stack of dies in one package. The final package for a semiconductor with stacked dies is much smaller than would result if the dies were each packaged separately. In addition to providing a smaller size, these packages offer a number of advantages that relate to the manufacturing of the package such as ease of handling and assembling.

In a stacked die arrangement, the dies are wire bonded sequentially, typically with automated wire bonding equipment employing well-known thermal-compression or ultrasonic wire bonding techniques. During the wire bonding process, the head of a wire bonding apparatus applies a downward pressure on a conductive wire held in contact with a wire-bonding pad on the die to weld, or bond, the wire to the bonding pad on the die.

In many cases, stacked die semiconductors can be fabricated faster and more cheaply than several semiconductors each having a single die, which performs the same functions. This approach is advantageous because of the increase in circuit density achieved.

Despite efforts to overcome problems resulting in lower yields of semiconductor packages with stacked dies problems still exist. In particular, dies within the stack fail prematurely.

Additionally, at least one die often overlies a plurality of other active or passive components making designing of such semiconductor packages more difficult.

Furthermore, the layout of bonding pads on the substrate is difficult resulting in bonding wires of various lengths being used. The placement, as well as the parasitic inductance and parasitic capacitance of various length bonding wires, needs to be taken into account during the design of the semiconductor package.

Also, an upper die can crack during wire bonding of the upper die due to lack of vertical support if the upper die overhangs the next lower die in the stack of dies. Consequently, smaller dies usually are placed on top of larger dies in semiconductor packages having stacked dies.

Heat dissipation in semiconductor packages having multiple dies also is a problem. The more dies that are placed in a semiconductor package, the greater the problem with heat dissipation.

The presence of multiple dies in a semiconductor package also causes problems with the flow of the molding compound used to encapsulate the dies in forming the semiconductor package.

There also is a problem with designing suitable electrical ground paths to the dies in a stacked die semiconductor package.

Additionally, when multiple dies are stacked in a semiconductor package more adhesive material is used in the semiconductor package. Adhesive materials have the tendency to absorb moisture, which can have adverse effects on the dies that reduce the reliability and useful life of the semiconductor package.

Furthermore, there is a thermal mismatch between the materials used to position the stacked dies in the semiconductor package and the substrate. The resulting relative motion of the dies with respect to the substrate has an adverse effect on the reliability of solder balls used to wire-bond the dies to the substrate.

Solutions to these problems have been long sought but prior developments have not taught or suggested any solutions and, thus, solutions to these problems have long eluded those skilled in the art.

DISCLOSURE OF THE INVENTION

The present invention provides a semiconductor package including a substrate. A crenellated spacer is attached to the substrate. At least one top die is attached to the crenellated spacer. The at least one top die is wire bonded to the substrate, and an encapsulant is formed over the crenellated spacer and the at least one top die.

The present invention provides the ability to facilitate the design of semiconductor packages in which at least one die overlies another die or a plurality of other active or passive components.

Furthermore, the layout of bonding pads on the substrate is easier resulting in bonding wires of more uniform lengths being used. The problem of placement of wires as well as the parasitic inductance and parasitic capacitance of various length bonding wires are reduced resulting in quicker and less expensive design of the semiconductor package.

In addition, incidences of an upper die cracking during wire bonding of the upper die is reduced thereby providing more freedom in the design and location of various sized dies in semiconductor packages having stacked dies.

The present invention also alleviates problems associated with heat dissipation in semiconductor packages having multiple dies allowing more dies to be placed in a given semiconductor package.

The present invention additionally reduces the problems associated with the flow of the molding compound used to encapsulate the semiconductor package.

Problems with designing suitable ground paths between the dies in a stacked die semiconductor package and a ground ring that is usually located on the substrate also are reduced.

Additionally, the present invention reduces the amount of adhesive material used when multiple dies are stacked in a semiconductor package thereby reducing the amount of moisture that can be absorbed into the semiconductor package.

Furthermore, the reliability of solder balls used in semiconductor packages having stacked dies is increased.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the apparatus/device are semi-diagrammatic and not to scale and, particularly, some of the dimensions are for the clarity of presentation and are shown greatly exaggerated in the FIGs. Generally, the device can be operated in any orientation.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "over", "under" and "beneath" are defined with respect to the horizontal plane.

Figure 1:
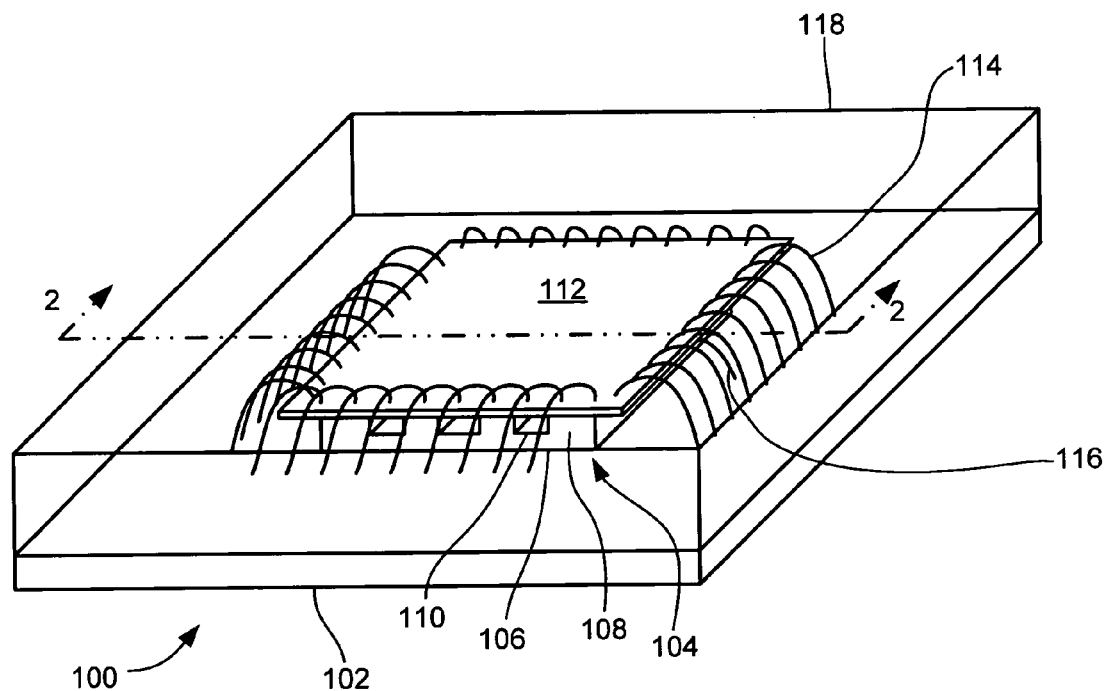
FIG. 1 is a perspective view of a semiconductor package manufactured in accordance with one embodiment of the present invention.

Referring now to FIG. 1, therein is shown a perspective view of a semiconductor package 100 manufactured in accordance with one embodiment of the present invention. The semiconductor package 100 includes a substrate 102. The substrate 102 has a crenellated spacer 104 positioned on the substrate 102. The crenellated spacer 104 is attached to the substrate 102 using a suitable adhesive material. As used herein, adhesive materials or layers are at least one of an adhesive tape, a curable adhesive paste, other suitable adhesive, and combinations thereof unless otherwise indicated.

The crenellated spacer 104 includes a base 106 and a number of merlons 108, or raised portions, attached to the base 106. Adjacent ones of the number of merlons 108 are separated by one of a number of embrasures 110, or spaces, positioned around the base 106. The crenellated spacer 104 provides support for a top die 112. The number of merlons 108 provides support for the top die 112. The top die 112 is attached to the number of merlons 108 using an adhesive layer discussed below in more detail with reference to FIG. 2. Although shown herein as square or rectangular, the base, the number of merlons 108, and the number of embrasures 110 may define square, rectangular, triangular, trapezoidal, rounded, or arched shapes and notches, and the number of merlons 108 may extend from the base or from a distance from the base.

The crenellated spacer 104 can be formed to a predetermined height and shape using forming processes, such as molding, stamping or etching processes that are known in the industry, depending upon the material used to form the crenellated spacer 104. The crenellated spacer 104 preferably is formed from a thermally and electrically conductive material, such as at least one of ceramic, metal, compounds thereof, and combinations thereof. Examples of metals that are suitable are copper, aluminum, and alloys thereof.

Additionally, the crenellated spacer 104 uses less adhesive materials, which have a tendency to absorb moisture, to attach the top die 112 to the number of merlons 108. Thus, the semiconductor package 100 reduces the adverse effects of moisture on the dies in the semiconductor package 100.

Furthermore, due to the reduced contact area between the crenellated spacer 104 and the top die 112 the effect of the thermal coefficient of expansion mismatch between the crenellated spacer 104 and the top die 112 is reduced resulting in less relative movement between the crenellated spacer 104 and the top die 112.

The top die 112 is electrically connected to the substrate 102 using a first number of wires 114, such as a number of fine, conductive wires that typically are gold (Au) or aluminum (Al). A number of first ground wires 116 is connected between the crenellated spacer 104 and the substrate 102 as is explained in more detail with reference to FIG. 2. Preferably, the number of merlons 108 is positioned to support the bond pad area of the top die 112 to provide support for the top die 112 during wire bonding of the top die 112 thereby reducing the likelihood of cracking the top die 112 during wire bonding.

An encapsulant 118 encapsulates the substrate 102 and the structures positioned on the substrate 102 to form the semiconductor package 100. The structure of the crenellated spacer 104 facilitates better flow of the encapsulant 118 under the top die 112 during the molding process. Additionally, the crenellated spacer 104 allows dissipation of heat from the top die 112 during operation of the semiconductor package 100.

Figure 2:
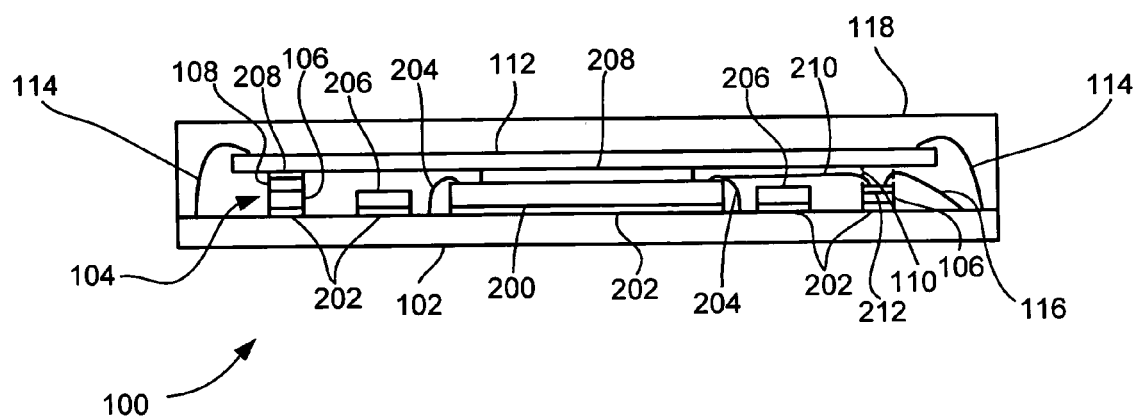
FIG. 2 is a cross-sectional view of the structure of FIG. 1 taken along line 2—2.

Referring now to FIG. 2, therein is shown a cross-sectional view of the structure of FIG. 1 taken along line 2—2. A lower die 200 is attached to the substrate 102 using a first adhesive layer 202. The lower die 200 is electrically connected to the substrate 102 using a second number of wires 204, such as a number of fine, conductive wires that typically are gold (Au) or aluminum (Al). A number of additional components 206 may be attached to the substrate 102 depending upon the particular semiconductor package design. The number of additional components 206 is attached to the substrate 102 using the first adhesive layer 202. The number of additional components 206 can be active or passive components, such as, for example, additional dies, capacitors, or other electronic components. The first adhesive layer 202 also is used to attach the base 106 of the crenellated spacer 104 to the substrate 102.

The number of merlons 108 supports the top die 112. The top die 112 is attached to the merlons 108 of the crenellated spacer 104 and the upper surface of the lower die 200 using a second adhesive layer 208.

A second ground wire 210 is connected between the lower die 200 and the upper surface of the base 106 of the crenellated spacer 104 in the area of at least one of the number of embrasures 110. The upper surface of the base 106 of the crenellated spacer 104 where the second ground wire 210 is connected is plated or otherwise coated with a conductive layer 212. The conductive layer 212 preferably is a metal of at least one of gold, silver, tin, nickel, alloys thereof, and combinations thereof. The first ground wire 116 is connected between the upper surface of the base 106 of the crenellated spacer 104 and the substrate 102. Thus, a ground path is provided between the lower die 200 and the substrate 102.

Figure 3:
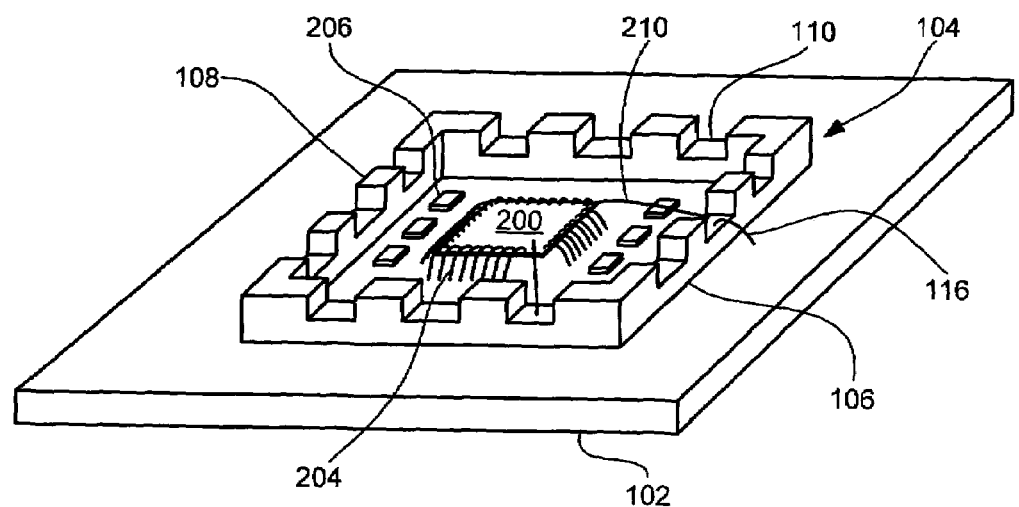
FIG. 3 is a perspective view of the structure of FIG. 1 having a ground bonding wire with an encapsulant and a top die removed.

Referring now to FIG. 3, therein is shown a perspective view of the structure of FIG. 1 with the encapsulant 118 and the top die 112 shown in FIGS. 1 and 2 removed. The substrate 102 has the lower die 200 attached to the substrate 102 using an adhesive layer as shown in FIG. 2. The lower die 200 is electrically connected to the substrate 102 using a second number of wires 204. The number of first ground wires 116 is connected between some of the number of embrasures 110 and the substrate 102. The number of second ground wires 210 is connected between the lower die 200 and some of the embrasures 110. Thus, a ground path is provided between the lower die 200 and the substrate 102. The crenellated spacer 104 is a closed loop formation surrounding the lower die 200 and the number of additional components 206.

Figure 4:
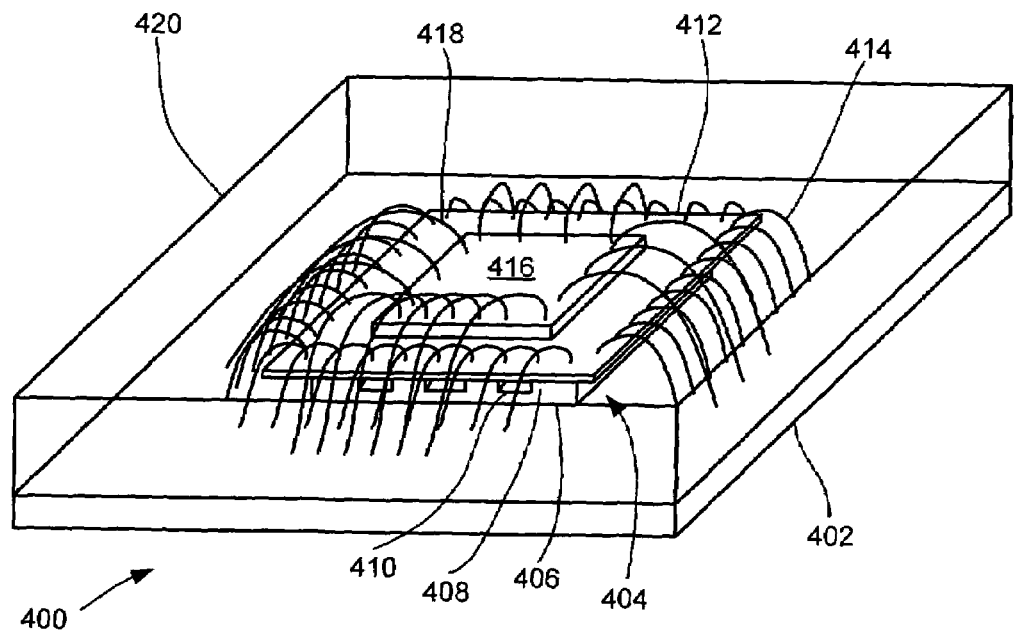
FIG. 4 is a perspective view of a semiconductor package having a smaller top die manufactured in accordance with another embodiment of the present invention.

Referring now to FIG. 4, therein is shown a perspective view of a semiconductor package 400 manufactured in accordance with another embodiment of the present invention. The semiconductor package 400 includes a substrate 402. The substrate 402 has a crenellated spacer 404 positioned on the substrate 402. The crenellated spacer 404 is attached to the substrate 402 using a suitable adhesive material.

The crenellated spacer 404 includes a base 406 and a number of merlons 408, or raised portions, attached to the base 406. Adjacent ones of the number of merlons 408 are separated by one of a number of embrasures 410, or spaces, positioned around the base 406. The crenellated spacer 404 provides support for a first top die 412. The number of merlons 408 supports the first top die 412. The first top die 412 is attached to the number of merlons 408 using an adhesive layer.

The crenellated spacer 404 can be formed to a predetermined height and shape using forming processes, such as molding, stamping or etching processes that are known in the industry, depending upon the material used to form the crenellated spacer 404. The crenellated spacer 404 preferably is formed from a thermally and electrically conductive material, such as at least one of ceramic, metal, compounds thereof, and combinations thereof. Examples of metals that are suitable are copper, aluminum, and alloys thereof.

Additionally, the crenellated spacer 404 uses less adhesive materials, which have a tendency to absorb moisture, to attach the first top die 412 to the number of merlons 108. Thus, the semiconductor package 400 reduces the adverse effects of moisture on the dies in the semiconductor package 100.

Furthermore, due to the reduced contact area between the crenellated spacer 404 and the first top die 412 the effect of the thermal coefficient of expansion mismatch between the crenellated spacer 404 and the first top die 412 is reduced resulting in less relative movement between the crenellated spacer 404 and the first top die 412.

The first top die 412 is electrically connected to the substrate 402 using a first number of wires 414, such as a number of fine, conductive wires that typically are gold (Au) or aluminum (Al). Preferably, the number of merlons 408 is positioned to support the bond pad area (not shown) of the first top die 412 to provide support for the first top die 412 during wirebonding of the first top die 412 thereby reducing the likelihood of cracking the first top die 412 during wire bonding.

A second top die 416 is attached to the first top die 412 using a suitable adhesive. The second top die 412 is electrically connected to the substrate 402 using a second number of wires 418.

An encapsulant 420 encapsulates the substrate 402 and the structures positioned on the substrate 402 to form the semiconductor package 400. The structure of the crenellated spacer 404 facilitates better flow of the encapsulant 420 under the first top die 412 during the molding process. Additionally, the crenellated spacer 404 allows dissipation of heat from the first top die 412 and the second top die 416 during operation of the semiconductor package 400.

Figure 5:
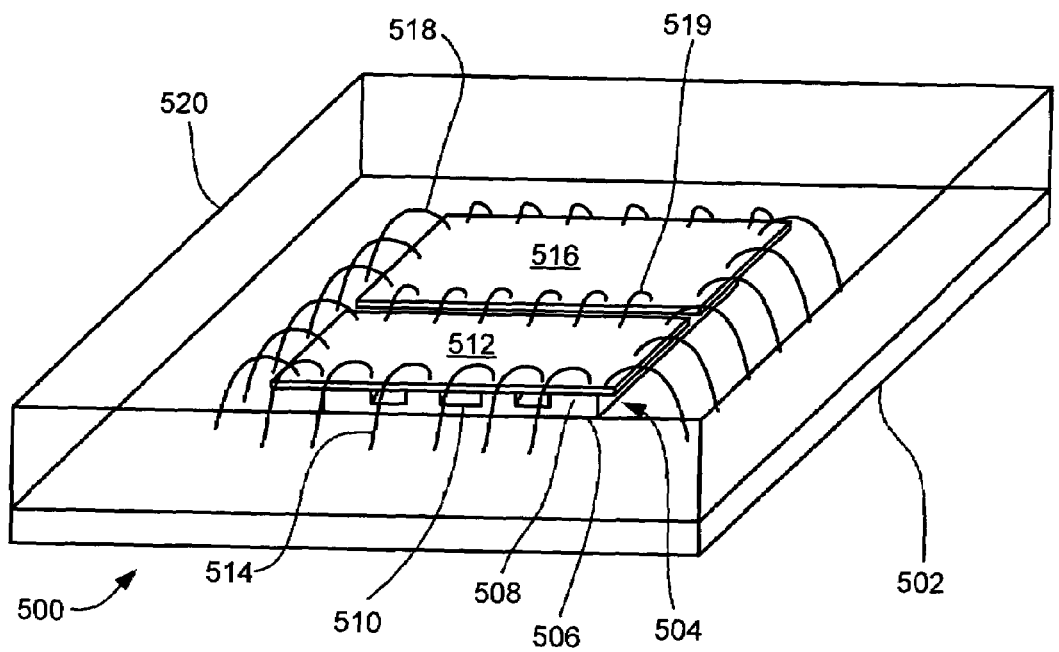
FIG. 5 is a perspective view of a semiconductor package having multiple top dies positioned side by side in accordance with another embodiment of the present invention.

Referring now to FIG. 5, therein is shown a perspective view of a semiconductor package 500 in accordance with another embodiment of the present invention. The semiconductor package 500 includes a substrate 502. The substrate 502 has a crenellated spacer 504 positioned on the substrate 502. The crenellated spacer 504 is attached to the substrate 502 using a suitable adhesive material.

The crenellated spacer 504 includes a base 506 and a number of merlons 508, or raised portions, attached to the base 506. Adjacent ones of the number of merlons 508 are separated by one of a number of embrasures 510, or spaces, positioned around the base 506. The crenellated spacer 504 provides support for a first top die 512. The number of merlons 508 supports the first top die 512. The first top die 512 is attached to the number of merlons 508 using an adhesive layer.

The crenellated spacer 504 can be formed to a predetermined height and shape using forming processes, such as molding, stamping or etching processes that are known in the industry, depending upon the material used to form the crenellated spacer 504. The crenellated spacer 504 preferably is formed from a thermally and electrically conductive material, such as at least one of ceramic, metal, compounds thereof, and combinations thereof. Examples of metals that are suitable are copper, aluminum, and alloys thereof.

Additionally, the crenellated spacer 504 uses less adhesive materials, which have a tendency to absorb moisture, to attach the first top die 512 to the number of merlons 108. Thus, the semiconductor package 500 reduces the adverse effects of moisture on the dies in the semiconductor package 100.

Furthermore, due to the reduced contact area between the crenellated spacer 504 and the first top die 512 the effect of the thermal coefficient of expansion mismatch between the crenellated spacer 504 and the first top die 512 is reduced resulting in less relative movement between the crenellated spacer 504 and the first top die 512.

The first top die 512 is electrically connected to the substrate 502 using a first number of wires 514, such as a number of fine, conductive wires that typically are gold (Au) or aluminum (Al). Preferably, the number of merlons 508 is positioned to support the bond pad area (not shown) of the first top die 512 to provide support for the first top die 512 during wire bonding of the first top die 512 thereby reducing the likelihood of cracking the first top die 512 during wire bonding.

The crenellated spacer 504 also provides support for a second top die 516. The number of merlons 508 supports the second top die 516. The second top die 516 is attached to the number of merlons 508 using an adhesive layer.

The second top die 516 is positioned next to the first top die 512 in a side-by-side manner. The second top die 516 is electrically connected to the substrate 502 using a second number of wires 518. Additionally, the second top die 516 is electrically connected to the first top die 512 using a third number of wires 519.

An encapsulant 520 encapsulates the substrate 502 and the structures positioned on the substrate 502 to form the semiconductor package 500. The structure of the crenellated spacer 504 facilitates better flow of the encapsulant 520 under the first top die 512 and the second top die 516 during the molding process. Additionally, the crenellated spacer 504 allows dissipation of heat from the first top die 512 and the second top die 516 during operation of the semiconductor package 500.

Figure 6:
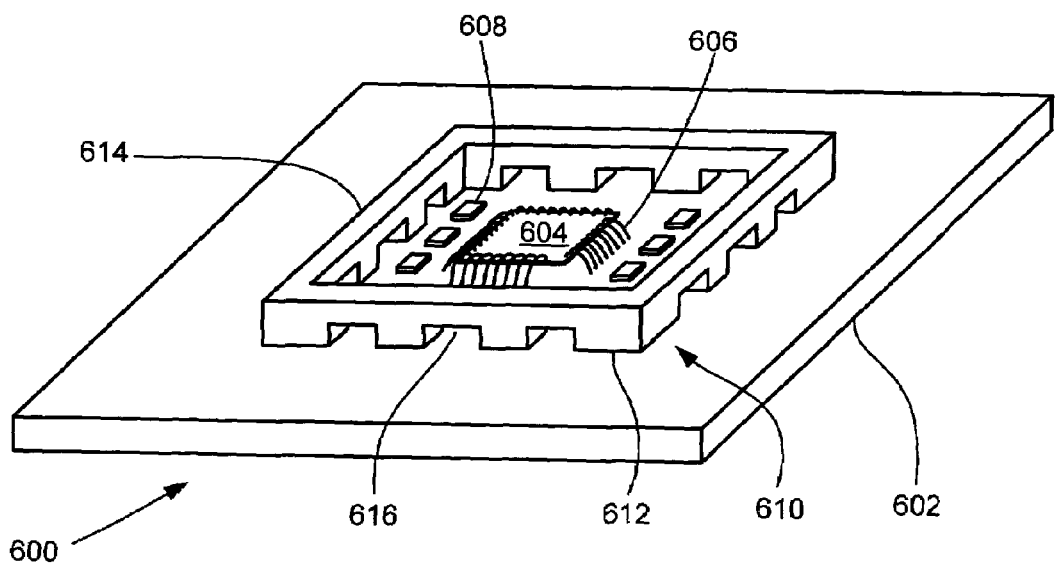
FIG. 6 is a perspective view of semiconductor package with an inverted spacer manufactured in accordance with another embodiment of the present invention with an encapsulant and a top die removed.

Referring now to FIG. 6, therein is shown a perspective view of a semiconductor package 600 manufactured in accordance with another embodiment of the present invention with an encapsulant and a top die removed. The semiconductor package 600 includes a substrate 602. A lower die 604 is attached to the substrate 602 using a suitable adhesive. The lower die 604 is electrically connected to the substrate 602 using a number of wires 606. A number of additional components 608 is attached to the substrate 602 around the lower die 604. A crenellated spacer 610 in a closed loop formation surrounds the lower die 604 and the number of additional components 608.

The crenellated spacer 610 includes a number of merlons 612, or raised portions, positioned around a base 614. Adjacent ones of the number of merlons 612 are separated by one of a number of embrasures 616, or spaces, positioned around the base 614. The number of merlons 612 is attached to the substrate 602 using a suitable adhesive. The base 614 is on top of the merlons 612. It will be apparent to those skilled in the art from a reading of this description that another die can be positioned over the base 614 and electrically connected to the substrate 602 prior to encapsulation to form the semiconductor package 600.

The base 614 of the crenellated spacer 610 provides support for another die attached to the top of the base 614 during wire bonding of the other die. Additionally, a die attach adhesive can be applied to the surface of the base 614 in a continuous or segmented manner depending upon the manufacturing process being used. Furthermore, the number of merlons 612 and the number of embrasures 616 positioned adjacent the substrate 602 facilitate the flow of an encapsulant during the encapsulation process used to form the semiconductor package 600.

Figure 7:
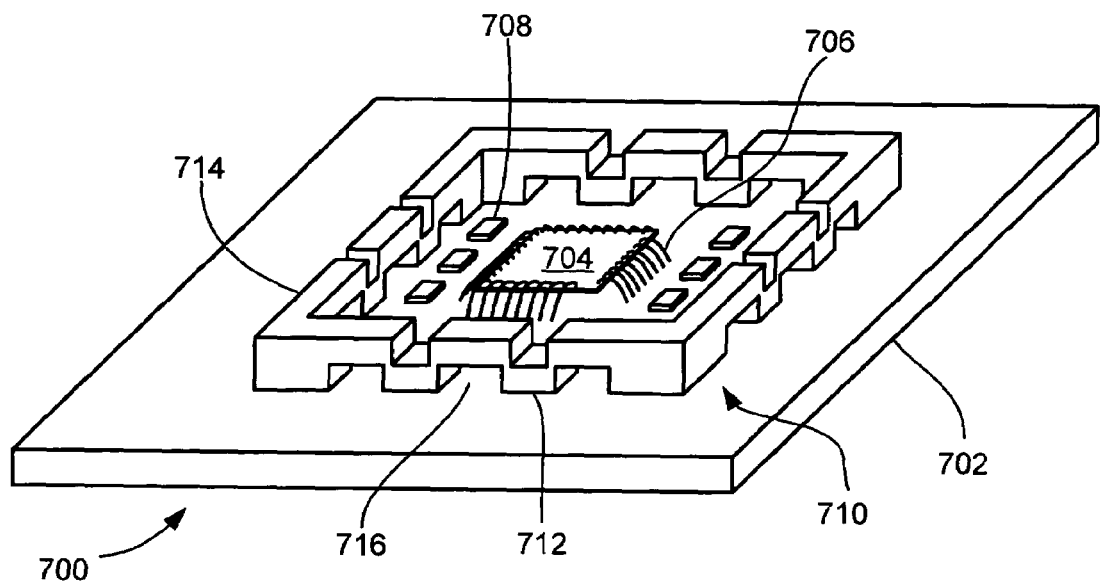
FIG. 7 is a perspective view of a semiconductor package having a crenellated base manufactured in accordance with another embodiment of the present invention with an encapsulant and a top die removed.

Referring now to FIG. 7, therein is shown a perspective view of a semiconductor package 700 manufactured in accordance with another embodiment of the present invention with an encapsulant and a top die removed. The semiconductor package 700 includes a substrate 702. A lower die 704 is attached to the substrate 702 using a suitable adhesive. The lower die 704 is electrically connected to the substrate 702 using a number of wires 706. A number of additional components 708 is attached to the substrate 702 around the lower die 704. A crenellated spacer 710 in a closed loop formation surrounds the lower die 704 and the number of additional components 708.

The crenellated spacer 710 includes a number of merlons 712, or raised portions, positioned around a crenellated base 714. Adjacent ones of the number of merlons 712 are separated by on of a number of embrasures 716, or spaces, positioned around the crenellated base 714. The number of merlons 712 is attached to the substrate 702 using a suitable adhesive. The crenellated base 714 is positioned on top of the merlons 712. It will be apparent to those skilled in the art from a reading of this description that another die can be positioned over the crenellated base 714 and electrically connected to the substrate 702 prior to encapsulation to form the semiconductor package 700.

The crenellated base 714 provides support for another die attached to the top of the crenellated base 714 during wire bonding of the other die. Furthermore, the number of merlons 712 and the number of embrasures 716 positioned around the crenellated spacer 710 facilitate the flow of an encapsulant during the encapsulation process used to form the semiconductor package 700.

Figure 8:
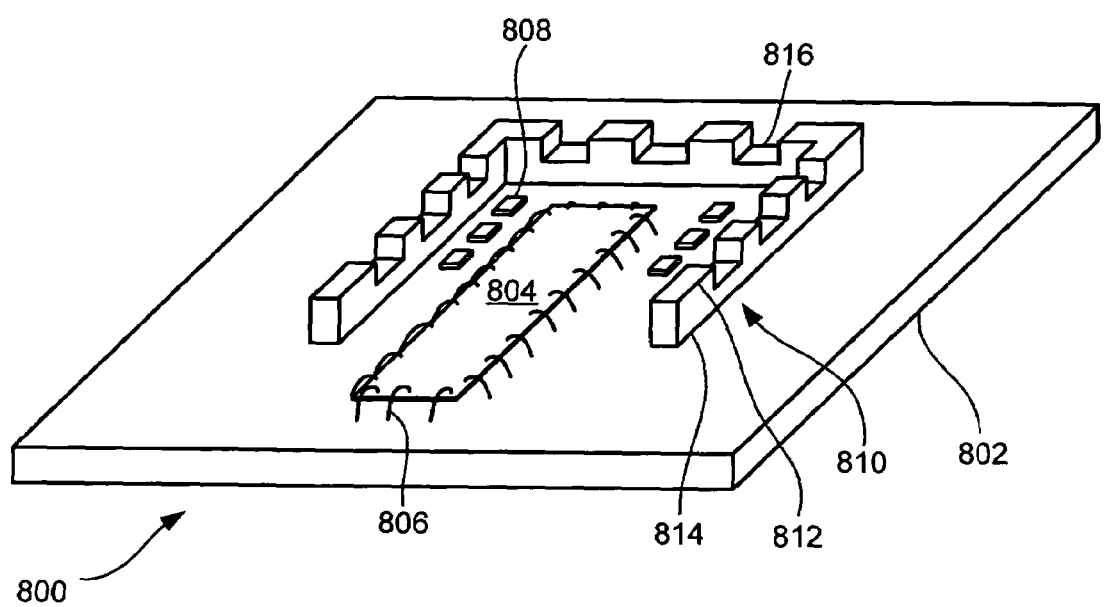
FIG. 8 is a perspective view of a semiconductor package having an open loop spacer manufactured in accordance with another embodiment of the present invention with an encapsulant and a top die removed.

Referring now to FIG. 8, therein is shown a perspective view of a semiconductor package 800 manufactured in accordance with another embodiment of the present invention with an encapsulant and a top die removed. The semiconductor package 800 includes a substrate 802. A lower die 804 is attached to the substrate 802 using a suitable adhesive. The lower die 804 is electrically connected to the substrate 802 using a number of wires 806. A number of additional components 808 is attached to the substrate 802 around the lower die 804. A crenellated spacer 810 in an open loop formation surrounds the lower die 804 and the number of additional components 808 on three sides.

The crenellated spacer 810 includes a number of merlons 812, or raised portions, positioned around a base 814. Adjacent ones of the number of merlons 812 are separated by one of a number of embrasures 816, or spaces, positioned around the base 814. The number of merlons 812 is attached to the substrate 802 using a suitable adhesive. It will be apparent to those skilled in the art from a reading of this description that prior to encapsulation to form the semiconductor package 800 another die can be attached to the number of merlons 812 and electrically connected to the substrate 802.

The number of merlons 812 of the crenellated spacer 810 provides support for another die attached to the number of merlons 812 during wire bonding of the other die. Furthermore, the number of merlons 812 and the number of embrasures 816 positioned around the crenellated spacer 810 facilitate the flow of an encapsulant during the encapsulation process used to form the semiconductor package 800. It will be apparent to those skilled in the art from a reading of this description that another form of open formation can include two or more spaced apart crenellated spacers. The spaced apart crenellated spacers can be parallel to one another or positioned at an angle with one another.

Figure 9:
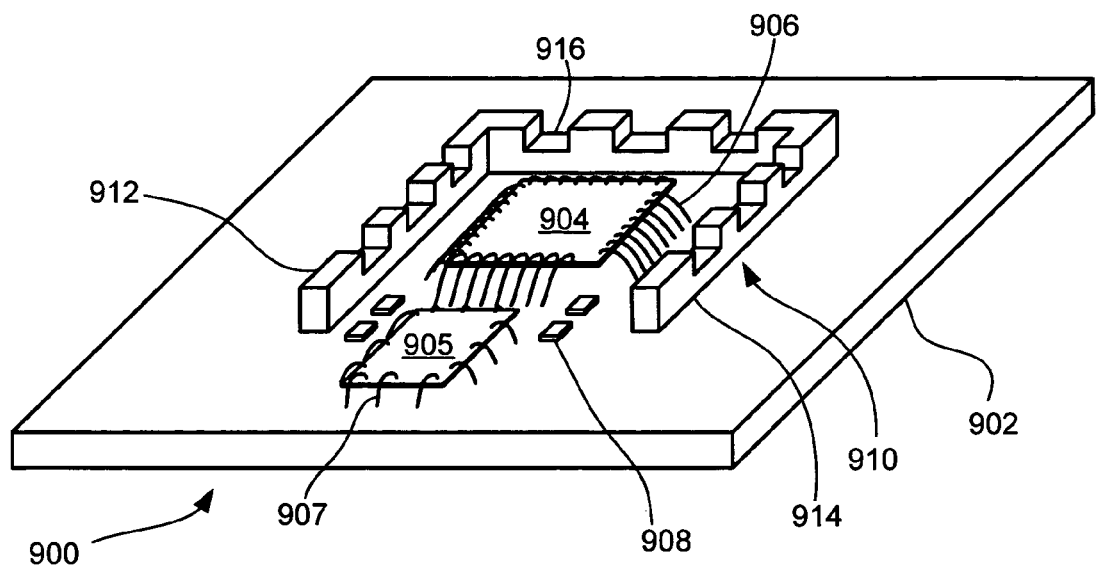
FIG. 9 is a perspective view of a semiconductor package having an open loop spacer and multiple lower dies manufactured in accordance with another embodiment of the present invention with an encapsulant and a top die removed.

Referring now to FIG. 9, therein is shown a perspective view of a semiconductor package 900 manufactured in accordance with another embodiment of the present invention with an encapsulant and a top die removed. The semiconductor package 900 includes a substrate 902. A first lower die 904 is attached to the substrate 902 using a suitable adhesive. The first lower die 904 is electrically connected to the substrate 902 using a first number of wires 906. A second lower die 905 is attached to the substrate 902 using a suitable adhesive. The second lower die 905 is electrically connected to the substrate 902 using a second number of wires 907.

A number of additional components 908 is attached to the substrate 902 around the first lower die 904. A crenellated spacer 910 in an open loop formation surrounds the first lower die 904, a portion of the second lower die 905, and some of the number of additional components 908. The second lower die 905 and some of the number of additional components 908 extend outwardly through the open portion of the crenellated spacer 910.

The crenellated spacer 910 includes a number of merlons 912, or raised portions, positioned around a base 914. Adjacent ones of the number of merlons 912 are separated by one of a number of embrasures 916, or spaces, positioned around the base 914. The base 914 is attached to the substrate 902 using a suitable adhesive. It will be apparent to those skilled in the art from a reading of this description that another die can be positioned over the number of merlons 912 and the number of embrasures 916 and electrically connected to the substrate 902 prior to encapsulation to form the semiconductor package 900.

The base 914 provides support for another die attached to the top of the base 914 during wire bonding. Furthermore, the number of merlons 912 and the number of embrasures 916 positioned around the crenellated spacer 910 facilitate the flow of an encapsulant during the encapsulation process used to form the semiconductor package 900.

It has been discovered that the semiconductor package of the present invention can accommodate at least one lower die and at least one top die using a crenellated spacer having a formation of at least one of a closed loop, an open loop, and combinations thereof.

Figure 10:
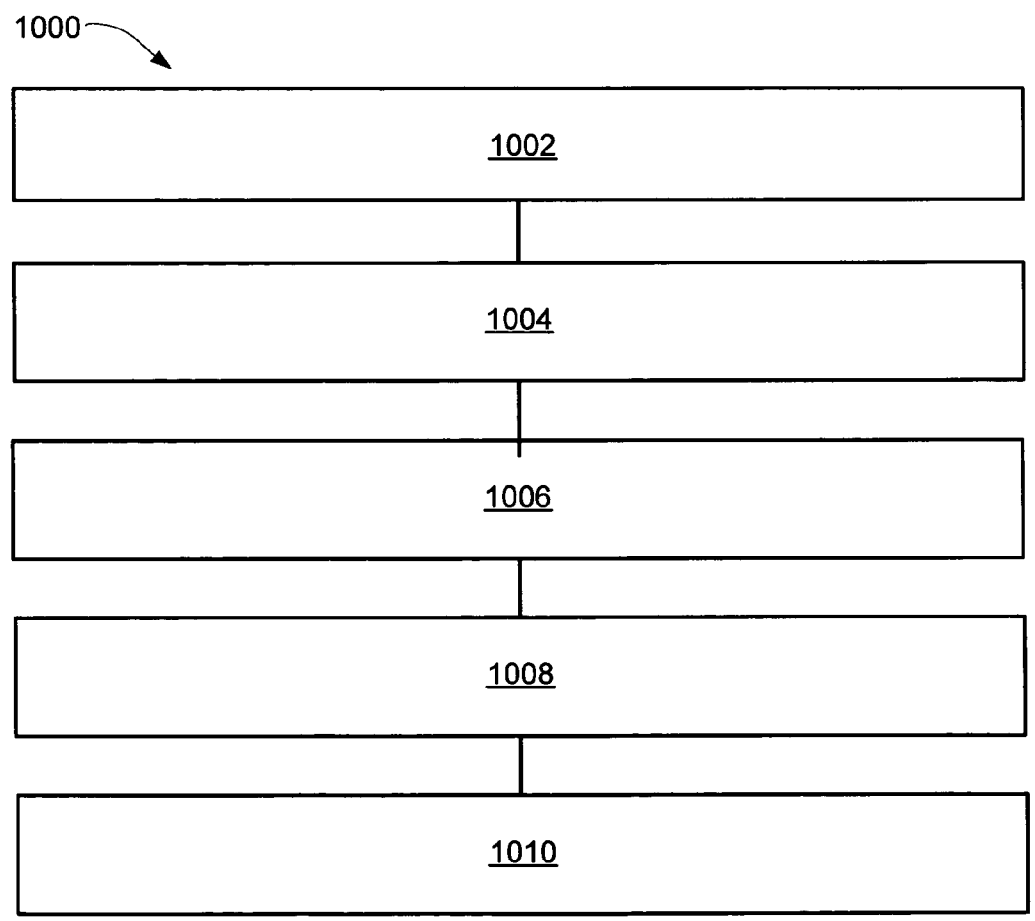
FIG. 10 is a flow chart of a method according to an embodiment of the present invention.

Referring now to FIG. 10, therein is shown a flow chart of a method 1000 for manufacturing a semiconductor package. The method 1000 includes providing a substrate in a block 1002; attaching a crenellated spacer to the substrate in a block 1004; attaching at least one top die to the crenellated spacer in a block 1006; wire bonding the at least one top die to the substrate in a block 1008; and forming an encapsulant over the crenellated spacer and the at last one top die in a block 1010.

Thus, it has been discovered that the present invention furnishes important and heretofore unavailable solutions, capabilities, and functional advantages for manufacturing a semiconductor package. The resulting process and configurations are straightforward, economical, uncomplicated, highly versatile, and effective, use conventional technologies, and are thus readily suited for manufacturing semiconductor devices that are fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters set forth herein or shown in the accompanying drawings are to be interpreted in an illustrative and non-limiting sense.

The invention claimed is:

1. A method of manufacturing a semiconductor package comprising:
    providing a substrate;
    attaching a crenellated spacer to the substrate wherein the crenellated spacer comprises:
        a base;
        a number of merlons on the base; and
        a number of embrasures intermediate adjacent ones of the number of merlons;
    attaching at least one top die to at least some of the number of merlons;
    wire bonding the at least one top die to the substrate; and
    forming an encapsulant over the crenellated spacer and the at last one top die.

2. The method of manufacturing a semiconductor package as claimed in claim 1 further comprising:
    attaching at least one of a lower die, an active component, a passive component, and combinations thereof to the substrate at least partially beneath at least one of the at least one of the top die.

3. The method of manufacturing a semiconductor package as claimed in claim 1 wherein:
    attaching a crenellated spacer attaches a crenellated spacer having a formation of at least one of a closed loop, an open loop, and combinations thereof.

4. The method of manufacturing a semiconductor package as claimed in claim 1 wherein:
    attaching the at least one top die to the crenellated spacer attaches the at least one top die to at least a portion of the base.

5. A method of manufacturing a semiconductor package comprising:
    providing a substrate;
    attaching at least one of a lower die, an active component, a passive component, and combinations thereof to the substrate;
    wire bonding the at least one lower die to the substrate;
    attaching a crenellated spacer to the substrate at least partially around the at least one lower die wherein the crenellated spacer comprises;
        a base;
        a number of merlons on the base;
        a number of embrasures intermediate adjacent ones of the number of merlons;
    attaching at least one top die to at least some of the number of merlons;
    wire bonding the at least one top die to the substrate; and
    forming an encapsulant over the at least one lower die, the crenellated spacer, and the at least one top die.

6. The method of manufacturing a semiconductor package as claimed in claim 5 wherein:
    attaching a crenellated spacer attaches a crenellated spacer having a formation of at least one of a closed loop, an open loop, and combinations thereof.

7. The method of manufacturing a semiconductor package as claimed in claim 5 wherein:
    attaching the at least top die to the crenellated spacer attaches the at least one top die to at least a portion of the base.

8. The method of manufacturing a semiconductor package as claimed in claim 5 wherein:
    attaching a crenellated spacer attaches a ground pad.

9. A semiconductor package comprising:
a substrate;
a crenellated spacer attached to the substrate wherein the crenellated spacer comprises:
a base;
a number of merlons on the base;
a number of embrasures intermediate adjacent ones of the number of merlons;
at least one top die attached to at least some of the number of merlons;
wires bonding the at least one top die to the substrate; and
an encapsulant over the crenellated spacer and the at least one top die.

10. The semiconductor package as claimed in claim 1 further comprising:
attaching at least one of a lower die, an active component, a passive component, and combinations thereof to the substrate at least partially beneath the at least one top die.

11. The semiconductor package as claimed in claim 9 wherein:
the crenellated spacer has a formation of at least one of a closed loop, an open loop, and combinations thereof.

12. The semiconductor package as claimed in claim 9 wherein:
the at least one top die is attached to at least a portion of the base.

13. A semiconductor package comprising:
a substrate;
at least one of a lower die, an active component, a passive component, and combinations thereof attached to the substrate;
a first number of wires bonding the at least one lower die to the substrate;
a crenellated spacer attached to the substrate at least partially around the at least one lower die wherein the crenellated spacer comprises:
a base;
a number of merlons on the base;
a number of embrasures intermediate adjacent ones of the number of merlons;
at least one top die attached to at least some of the number of merlons;
a second number of wires bonding the at least one top die to the substrate; and
an encapsulant over the at least one lower die, the crenellated spacer, and the at least one top die.

14. The semiconductor package as claimed in claim 13 wherein:
the crenellated spacer has a formation of at least one of a closed loop, an open loop, and combinations thereof.

15. The method of manufacturing a semiconductor package as claimed in claim 13 wherein:
the at least one top die is attached to at least a portion of the base.

16. The method of manufacturing a semiconductor package as claimed in claim 13 wherein:
the crenellated spacer comprises a ground pad.

* * * * *

UNITED STATES PATENT AND TRADEMARK OFFICE
CERTIFICATE OF CORRECTION

| | |
|---|---|
| PATENT NO. | : 7,064,430 B2 |
| APPLICATION NO. | : 10/931919 |
| DATED | : June 20, 2006 |
| INVENTOR(S) | : Chow et al. |

Page 1 of 1

It is certified that error appears in the above-identified patent and that said Letters Patent is hereby corrected as shown below:

<u>Column 10</u>
    Claim 5, line 45, delete "comprises;" and insert therefor --comprises:--

<u>Column 11</u>
    Claim 10, line 14, delete "claim 1" and insert therefor --claim 9--

Signed and Sealed this

Twenty-ninth Day of August, 2006

JON W. DUDAS
*Director of the United States Patent and Trademark Office*